United States Patent
Mikalo et al.

(10) Patent No.: US 9,257,353 B1
(45) Date of Patent: Feb. 9, 2016

(54) INTEGRATED CIRCUITS WITH TEST STRUCTURES INCLUDING BI-DIRECTIONAL PROTECTION DIODES

(71) Applicant: GLOBALFOUNDRIES, Inc., Grand Cayman (KY)

(72) Inventors: Ricardo Pablo Mikalo, Heideblick (DE); Uwe Dersch, Dresden (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/523,266

(22) Filed: Oct. 24, 2014

(51) Int. Cl.
  *H01L 27/00* (2006.01)
  *H01L 21/66* (2006.01)
  *H01L 29/861* (2006.01)
  *H01L 27/02* (2006.01)
  *H01L 27/06* (2006.01)

(52) U.S. Cl.
  CPC ............ *H01L 22/34* (2013.01); *H01L 27/0255* (2013.01); *H01L 27/0266* (2013.01); *H01L 27/0629* (2013.01); *H01L 27/0676* (2013.01); *H01L 29/8613* (2013.01)

(58) Field of Classification Search
  CPC ............ H01L 27/0266; H01L 27/0676; H01L 27/0255; H01L 27/0629; H01L 29/8613; H01L 22/34
  See application file for complete search history.

(56) References Cited

U.S. PATENT DOCUMENTS

| | | | | |
|---|---|---|---|---|
| 5,808,326 A * | 9/1998 | Bernier | ............... | H01L 27/0248 257/109 |
| 7,180,136 B2 * | 2/2007 | Wei | ................... | H01L 29/78603 257/347 |
| 8,637,899 B2 * | 1/2014 | Salcedo | .............. | H01L 27/0262 257/173 |
| 8,796,729 B2 * | 8/2014 | Clarke | ................ | H01L 29/0692 257/109 |
| 8,913,357 B2 * | 12/2014 | Lai | ...................... | H01L 27/0248 361/56 |
| 8,964,341 B2 * | 2/2015 | Prabhu | ................ | H01L 27/0248 257/355 |
| 2013/0286516 A1 * | 10/2013 | Prabhu | ................ | H01L 27/0248 361/56 |
| 2013/0321963 A1 * | 12/2013 | Lai | ...................... | H01L 27/0248 361/56 |

* cited by examiner

*Primary Examiner* — Nikolay Yushin
(74) *Attorney, Agent, or Firm* — Ingrassia Fisher & Lorenz, P.C.

(57) ABSTRACT

Integrated circuits that include bi-directional protection diode structures are disclosed. In one example, an integrated circuit includes a test circuit portion for testing the functionality of the integrated circuit during or after fabrication of the integrated circuit. The test circuit portion includes first, second, and third diode structures and a resistor structure. The first and third diode structures are in parallel with one another and in series with the resistor, and the resistor and the first and third diode structures are in series with the second diode structure. The first and third diode structures are configured for current flow in a first direction and the second diode structure is configured for current flow in a second direction that is opposite the first direction.

20 Claims, 3 Drawing Sheets

INTEGRATED CIRCUITS WITH TEST STRUCTURES INCLUDING BI-DIRECTIONAL PROTECTION DIODES

TECHNICAL FIELD

The present disclosure generally relates to integrated circuits. More particularly, the present disclosure relates to integrated circuits with test structures including bi-directional protection diodes.

BACKGROUND

The majority of present day integrated circuits are implemented by using a plurality of interconnected field effect transistors (FETs), also called metal oxide semiconductor field effect transistors (MOSFETs), or simply MOS transistors. A MOS transistor includes a gate electrode as a control electrode and spaced apart source and drain regions between which a current can flow. A control voltage applied to the gate electrode controls the flow of current through a channel between the source and drain regions.

In an integrated circuit fabrication facility, a plurality of different product types are usually manufactured at the same time, such as memory chips of different design and storage capacity, CPUs of different design and operating speed and the like, wherein the number of different product types may even reach a hundred and more in production lines for manufacturing ASICs (application specific ICs). Since each of the different product types may require a specific process flow, different mask sets for the lithography, specific settings in the various process tools, such as deposition tools, etch tools, implantation tools, chemical mechanical polishing (CMP) tools, metrology tools and the like, may be necessary. Consequently, a plurality of different tool parameter settings and product types may be encountered simultaneously in a manufacturing environment, thereby also creating a huge amount of measurement data, since typically the measurement data are categorized in accordance with the product types, process flow specifics and the like.

The measurement data for controlling production processes, such as lithography processes and the like, may be obtained by dedicated structures, which may be positioned within the die region of the semiconductor wafer if a corresponding area consumption of these structures may be compatible with the overall design criteria of the circuit layout under consideration. In other cases, the test structures may typically be provided in an area outside of the actual die region, which may also be referred to as a frame of the wafer, which may be used for dicing the substrate when separating the individual die regions. As used in the present disclosure, the term "active portion" of the integrated circuit refers to those portions of the die including the functional circuits that are used during standard operation of the integrated circuit, whereas the "test portion" refers to those portions including the aforementioned test structure and may include, for example, the frame. During the complex manufacturing sequence for completing semiconductor devices, such as CPUs and the like, an immense amount of measurement data may be created, for instance by inspection tools and the like, due to the large number of complex manufacturing processes, the mutual dependencies of which may be difficult to assess, so that, usually, factory targets may be established for certain processes or sequences, which are assumed to provide process windows to obtain a desired degree of final electrical behavior of the completed devices. That is, the complex individual processes or related sequences may be monitored and controlled on the basis of respective inline measurement data such that the corresponding process results may be maintained within specified process margins, which in turn may be determined on the basis of the final electrical performance of the product under consideration.

Consequently, in view of enhanced overall process control and appropriately targeting the various processes on the basis of the final electrical performance, electrical measurement data may be created on the basis of dedicated test structures that may be provided in the frame region in combination with appropriate probe pads formed in the metallization system at a very advanced manufacturing stage. These electrical test structures may comprise appropriate circuit elements, such as transistors, conductive lines, capacitors and the like, which may be appropriately connected to the probe pads so as to allow dedicated measurement strategies for assessing electrical performance of the various circuit elements in the test structure, which may then be related to the performance of the circuit elements in the actual die region. These electrical measurement data may include resistance values of conductive structures, threshold voltages of transistors, drive current capability of the transistors, leakage currents and the like, wherein these electrical characteristics may be influenced by the large number of manufacturing processes involved.

In order to ensure that the dedicated test structures accurately reflect the performance of the devices in the active portion of the integrated circuit, the same design rules are often used to fabricate both the devices in the active portion and the dedicated test structures. One such design rule, well-known in the art, is the "antenna rule" that is employed to prevent against the "antenna effect." For example, in recent semiconductor process wiring steps, various plasma techniques have been used. The representative plasma techniques include dry etching at the wiring layer patterning, plasma TEOS film deposition of wiring layer insulating film in a multi-layered wiring step, and the like, for example, which will be hereinafter referred to as plasma steps. When plasma etching is executed, if a diffusion layer does not connect to metal wiring, plasma charges accumulate in the metal wiring and an electric current flows into the gate oxide film of the transistor to which the metal wiring connects. The current may potentially cause damage to the gate oxide film, change in the transistor characteristics because of film quality change of the gate oxide film, or degradation of the hot carrier life. Such phenomena are called "antenna effects," and damage caused by the antenna effect will be hereinafter referred to as "antenna damage."

To protect against antenna damage, countermeasures may be taken in accordance with various design rules that include the addition of a protection diode structure. As is known in the art, diodes only allow current to flow therethrough in one direction. If a protection diode is provided, plasma charges escape through a diffusion layer of the protection diode so that the occurrence of antenna damage is eliminated.

However, during certain testing procedures utilizing the testing structures, non-standard electrical biasing conditions are required for the electrical test structures. This especially happens in cases where negative gate bias has to be applied on NFETs or positive gate bias has to be applied on PFETs. Furthermore, depletion devices or zero-Vt devices regularly require opposite gate biasing. The inclusion of protection diodes in testing structures results in testing problems when opposite biasing conditions are required. That is, currently used protection diodes are not capable of operation under non-standard gate biasing conditions.

Accordingly, it is desirable to provide improved integrated circuits with testing structures that are operable under a broad range of testing conditions, including the application of both positive and negative biases. It is additionally desirable to provide integrated circuits that include test structures with protection diodes that are capable of operating under both positive and negative bias conditions. Furthermore, other desirable features and characteristics of the present disclosure will become apparent from the subsequent detailed description and the appended claims, taken in conjunction with the accompanying drawings and the foregoing technical field and background.

BRIEF SUMMARY

Integrated circuits that include bi-directional protection diode structures are disclosed. In one exemplary embodiment, an integrated circuit includes a test circuit portion for testing the functionality of the integrated circuit during or after fabrication of the integrated circuit. The test circuit portion includes first, second, and third diode structures and a resistor structure. The first and third diode structures are in parallel with one another and in series with the resistor, and the resistor and the first and third diode structures are in series with the second diode structure. The first and third diode structures are configured for current flow in a first direction and the second diode structure is configured for current flow in a second direction that is opposite the first direction.

In another exemplary embodiment, an integrated circuit includes an active circuit portion including a plurality of active semiconductor devices and a test circuit portion, separated from the active circuit portion, that includes a test circuit structure including a transistor and a bi-directional protection diode structure. The bi-directional protection diode structure includes a semiconductor substrate and, within the semiconductor substrate, a first well region having a first conductivity type and a second well region, adjacent to the first well region, having a second conductivity type. The bi-directional protection diode structure further includes a first raised structure disposed over and adjacent to the first well region and including a first p-n junction diode, a second raised structure disposed over and adjacent to the second well region and having the second conductivity type, and a third raised structure disposed over and adjacent to the second well region and including a second p-n junction diode. Still further, the bi-directional protection diode structure includes a first conductive connection line that electrically connects the first raised structure to the second raised structure and a second conductive connection line that electrically connects the third raised structure to a gate of the transistor.

In yet another exemplary embodiment, integrated circuit includes an active circuit portion including a plurality of active semiconductor devices and a test circuit portion, separated from the active circuit portion and positioned within a frame portion of the integrated circuit, which includes a test circuit structure including a p-type or an n-type transistor and a bi-directional protection diode structure. The bi-directional protection diode structure includes a semiconductor substrate including a p-type semiconductor material wherein the transistor is a n-type transistor or an n-type semiconductor material wherein the transistor is a p-type transistor and, within the semiconductor substrate, a p-type well region and an n-type well region that is adjacent to the p-type well region. The bi-directional protection diode structure further includes a first raised structure disposed over and adjacent to the p-type well region and including a first p-n junction diode, wherein a p-type portion of the first p-n junction diode is adjacent to the p-type well and an n-type portion of the first p-n junction diode is physically separated from the p-type well by the p-type portion, a second raised structure disposed over and adjacent to the n-type well, the second raised structure being wholly n-type and including first and second portions, wherein the first portion of the second raised structure is adjacent to the n-type well and has a doping concentration that is less than a doping concentration of the second portion of the first raised structure, the second portion being physically separated from the n-type well by the first portion of the second raised structure, and a third raised structure disposed over and adjacent to the n-type well region and including a second p-n junction diode, wherein an n-type portion of the second p-n junction diode is adjacent to the n-type well and a p-type portion of the second p-n junction diode is physically separated from the n-type well by the n-type portion. The bi-directional protection diode further includes a first contact structure electrically connecting the n-type portion of the first p-n junction diode to a first metallization layer of the integrated circuit, a second contact structure electrically connecting the second portion of the second raised structure to the first metallization layer, and a third contact structure electrically connecting the p-type portion of the second p-n junction diode to the first metallization layer. Still further, the bi-directional protection diode includes a first conductive connection line in the first metallization layer that electrically connects the first contact structure to the second contact structure, and a second conductive connection line in the first metallization layer that electrically connects the third contact structure to a gate of the transistor.

BRIEF DESCRIPTION OF THE DRAWINGS

The present disclosure will hereinafter be described in conjunction with the following drawing figures, wherein like numerals denote like elements, and wherein.

DETAILED DESCRIPTION

The following detailed description is merely illustrative in nature and is not intended to limit the embodiments of the subject matter or the application and uses of such embodiments. Furthermore, there is no intention to be bound by any expressed or implied theory presented in the preceding technical field, background, brief summary or the following detailed description.

Embodiments of the present disclosure are generally directed to integrated circuits that include bi-directional protection diode structures. For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein. In particular, various steps in the manufacture of semiconductor-based transistors are well-known and so, in the interest of brevity, many conventional steps will only be mentioned briefly herein or will be omitted entirely without providing the well-known process details.

As used herein, it will be understood that when an element or layer is referred to as being "on," "connected to" or "coupled to" another element or layer, it may be directly on, connected to, or coupled to the other element or layer, or intervening elements or layers may be present. Further, spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may likewise be interpreted accordingly.

Figure 1:
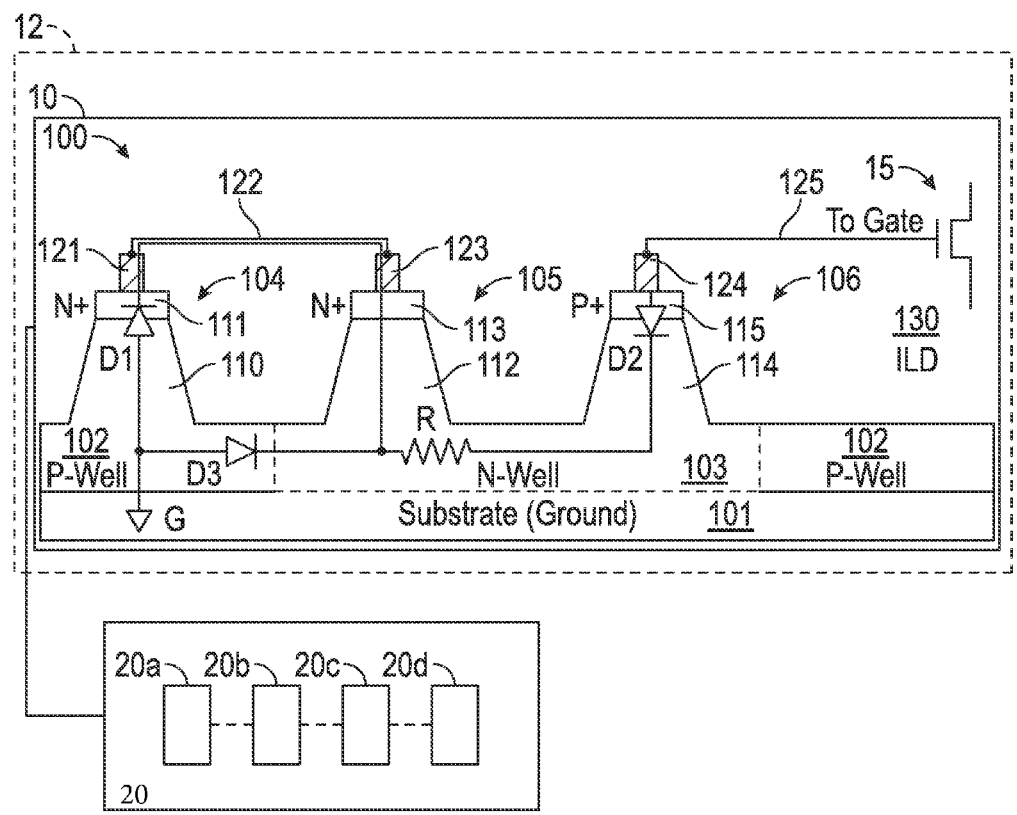
FIG. 1 provides a cross-sectional view with a super-imposed circuit diagram of a bi-directional protection diode in accordance with various embodiments of the present disclosure.

FIG. 1 provides a cross-sectional view with a super-imposed circuit diagram of a bi-directional protection diode 100 in accordance with various embodiments of the present disclosure. As initially noted above, and as shown in FIG. 1, modern integrated circuits may be fabricated with so-called "active portions" 20 on the die that include all of the semiconductor circuit devices (e.g., active semiconductor devices 20a-20d) required for the operation of the integrated circuit, as well as "test portions" 10 on and within the frame portion 12, separated from the active portions, that include circuit functionalities that are modeled after certain devices of the active portions for the purposes of testing the yield and functionality of such devices during or after fabrication of the integrated circuit. The bi-directional protection diode 100 shown in FIG. 1 should be understood as being provided in connection with the test portions 10 of the integrated circuit and may be used to provide protection against the above-noted "antenna effect" during fabrication of the integrated circuit.

In an embodiment, the bi-directional protection diode 100 is provided in electrical connection with a transistor structure 15 that is also within the test portion 10. Beneficially, the presently-disclosed bi-directional protection diodes of the present disclosure are capable of operating with either n-type or p-type transistor 15, thus the test circuit may be any MOS device, such as an NMOS device, a PMOS device, or a CMOS device. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate. For purposes of exemplary illustration, the implementation of a bi-directional protection diode in the context of an n-type transistor is illustrated in FIG. 2, which is described in greater detail below.

In an embodiment, the bi-directional protection diode structure 100 includes a semiconductor substrate 101 made of a semiconductor material. For an n-type transistor, the semiconductor substrate 101 includes p-type doping, whereas for a p-type transistor, the semiconductor substrate 101 includes n-type doping. The semiconductor material is preferably a silicon material as typically used in the semiconductor industry, e.g., relatively pure silicon as well as silicon admixed with other elements such as germanium, carbon, and the like. Alternatively, the semiconductor material may be germanium, gallium arsenide, or the like. The semiconductor material may be provided as a bulk semiconductor substrate, or it may be provided on a silicon-on-insulator (SOI) substrate, which includes a support substrate, an insulator layer on the support substrate, and a layer of silicon material on the insulator layer.

Within the semiconductor substrate 101 are disposed both a p-type well region 102 and an n-type well region 103, which is adjacent to the p-type well region 102. In an embodiment, to form the well regions 102, 103, a block mask is formed over the substrate so as to protect other regions from receiving the various implants for well formation. The block mask may include a conventional mask material that inhibits the penetration of ions into the blocked region during a subsequent implantation process. The well regions 102, 103 are formed using a high-energy implantation process in which the energy of the implantation is typically about 200 keV or greater (such as from about 200 keV to about 1000 keV) and the dose of dopant is about $10^{13}$ cm$^{-2}$ or greater (such as from about $10^{13}$ cm$^{-2}$ to about $10^{11}$ cm$^{-2}$).

In an embodiment, with continued reference to FIG. 1, the bi-directional protection diode 100 further includes three raised structures, including a first raised structure 104 disposed over and adjacent to the p-well region 102, a second raised structure 105 disposed over and adjacent to the n-well region 103, and a third raised structure 106 disposed over and adjacent to the n-well region 103. The first raised structure 104 includes a first p-n junction diode D1, which includes a p-type portion 110 adjacent to the p-type well 102 and an n-type portion 111 that is physically separated from the p-type well 102 by the p-type portion 110. The n-type portion 111, indicated in FIG. 1 with the symbol N$^+$, may be relatively more heavily doped with a greater concentration of dopant ions than the wells 102, 103.

The second raised structure 105 is wholly n-type and includes first and second portions 112, 113. The first portion 112 of the second raised structure 105 is adjacent to the n-type well 103 and has a doping concentration that is relatively less than a doping concentration of the second portion 113 of the first raised structure 103, which, as with the first raised portion 104, is indicated with the symbol N. The second portion 113 is physically separated from the n-type well 103 by the first portion 112.

The third raised structure 106 includes a second p-n junction diode D2, which includes an n-type portion 114 adjacent to the n-type well 103 and a p-type portion 115 that is physically separated from the n-type well 103 by the n-type portion 114. The p-type portion 115, indicated in FIG. 1 with the symbol P$^+$, may be relatively more heavily doped with a greater concentration of dopant ions than the wells 102, 103.

The first, second, and third raised portions 104, 105, 106 may be formed on the basis of a masking and etching process in combination with an epitaxial silicon growth process. Initially, the spaces between the portions 110, 112, and 114 may be formed using photolithographic patterning and etching procedures. That is, a photoresist layer is deposited and then is exposed to an image pattern and treated with a developing solution to form pattern openings within the photoresist layer. With the openings thus formed, the substrate 101 may be etched to form the spaces between portions 110, 112, and 114 for example using reactive ion etching using a suitable etching chemistry. On top of portions 110, 113, and 114, the relatively more heavily doped portions 111, 113, and 115 may be formed using epitaxial silicon growth processes. In an embodiment, epitaxy may be performed in the vapor phase using silicon tetrachloride, for example, along with a suitable dopant-providing gas such as such as arsine, phosphine, or diborane. Each of the first, second, and third raised structures 104, 105, 106 may be formed to a substantially equal height above the substrate 101, although varying heights are also possible in other embodiments. Further, each of the first, second, and third raised structures 104, 105, 106 may be formed with a substantially equal spacing therebetween, although irregular spacings are also possible in other embodiments.

Upon completion of the formation of portions 111, 113, and 115, an interlayer dielectric (ILD) material may be deposited to form an ILD layer 130 that is disposed over the substrate 101 and each of the three raised structures 104, 105, and 106. The ILD layer may be formed of one or more low-k dielectric materials, un-doped silicate glass (USG), silicon nitride, silicon oxynitride, or other commonly used materials. The dielectric constants (k value) of the low-k dielectric materials may be less than about 3.9, for example, less than about 2.8.

The bi-directional protection diode 100 further includes at least three contact structures 121, 123, and 124, one each for electrical connection with a respective raised structure 104, 105, and 106. The contacts are formed within the ILD layer 130, and are provided in direct physical connection with the relatively more heavily doped portions 111, 113, and 115. The contacts 121, 123, 124 may be formed by patterning and etching contact holes in the ILD layer 130 to the raised structures 104, 105, and 106, followed by the deposition of a conductive material, such as tungsten, aluminum, or copper, for example. A suitable planarization or etching process may subsequently be performed to remove any excess conductive material from over the ILD layer 130, and provide the contact structures 121, 123, and 124 with a substantially uniform height.

With continued attention to FIG. 1, a first metallization layer (M1) may be formed over the ILD layer 130. The M1 layer may include a plurality of conductive lines that electrically connect various portions of the integrated circuit, and in particular various portions of the test structures. The M1 layer may include a first conductive connection line 122 that electrically connects the first contact structure 121 to the second contact structure 123 (and thereby the first raised structure 104 to the second raised structure 105). The M1 layer may also include a second conductive connection line 125 that electrically connects the third contact structure 124 to a gate of the MOS transistor (not separately illustrated). The first and second conductive connection lines 122, 125 may be formed on the basis of a suitable conductive material deposition and patterning process, using aluminum or copper, for example, as the conductive material.

Attention is now directed to the overlaid circuit diagram portion of FIG. 1 in order to illustrate the functioning of the bi-directional diode structure hereinbefore described. As shown in FIG. 1, the circuit may be grounded ("G") to the substrate 101 on one end, and may be in electrical communication with the gate of the MOS transistor (not illustrated) at the other end. The circuit includes first, second, and third diode structures (D1, D2, D3, respectively) and a resistor structure (R). D1 is located at the p-n junction of the first raised structure 104 and allows current to flow from the p-type portion 110 to the n-type portion 111. D2 is located at the p-n junction of the third raised structure 106 and allows current to flow from the p-type portion 115 to the n-type portion 114 which, as shown, is in a flow direction that is opposite of D1. D3 is located at the p-n junction of the p-well 102 to the n-well 103. Further, the resistor R is indicated in the n-type doped region from the second raised structure 105 through the n-well region between the second and third raised structures 105, 106. The first and third diode structures (D1, D3) are in parallel with one another and in series with the resistor (R). The resistor (R) and the first and third diode structures (D1, D3) are in series with the second diode structure (D2). Regarding D3, being formed from two wells, this diode structure has a breakdown voltage that is significantly higher than the junction breakdown voltage of D1. Accordingly, when a potential difference is applied to the circuit, all of the current will flow across D1 and not D3. As such, D3 does not contribute to the functionality of the bi-directional protection diode 100. Furthermore, regarding resistor R, the series resistance should be maintained sufficiently low to allow sufficient current to pass through the circuit for testing purposes at the required test voltages, a property which may be adequately controlled by the doping concentration and relative size and position of the n-well 103 and the second raised structure 105.

Figure 2A:
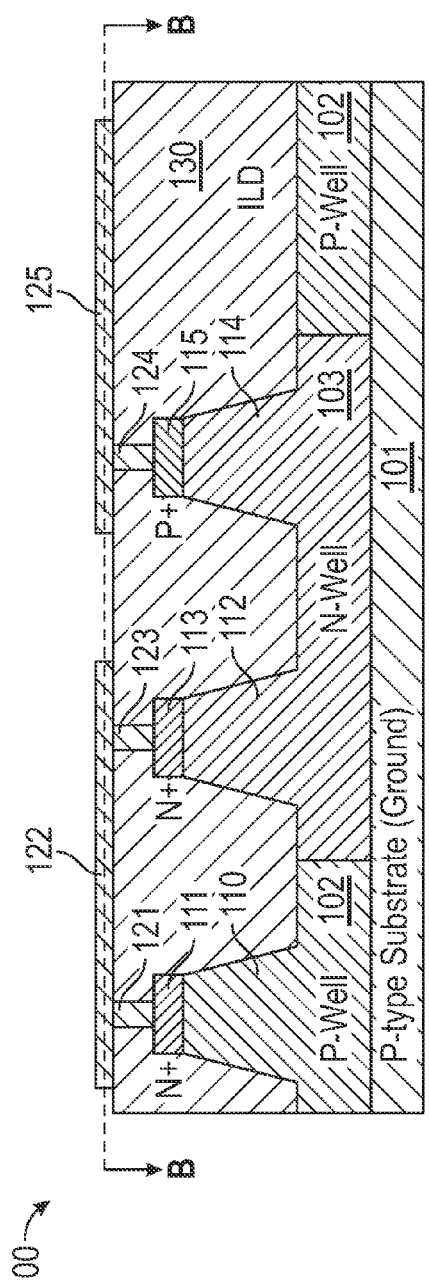
FIGS. 2A and 2B provide cross-sectional and top views, respectively, of the bi-directional protection diode of FIG. 1 applied in the context of an exemplary n-type field effect transistor functionality.
Figure 2B:
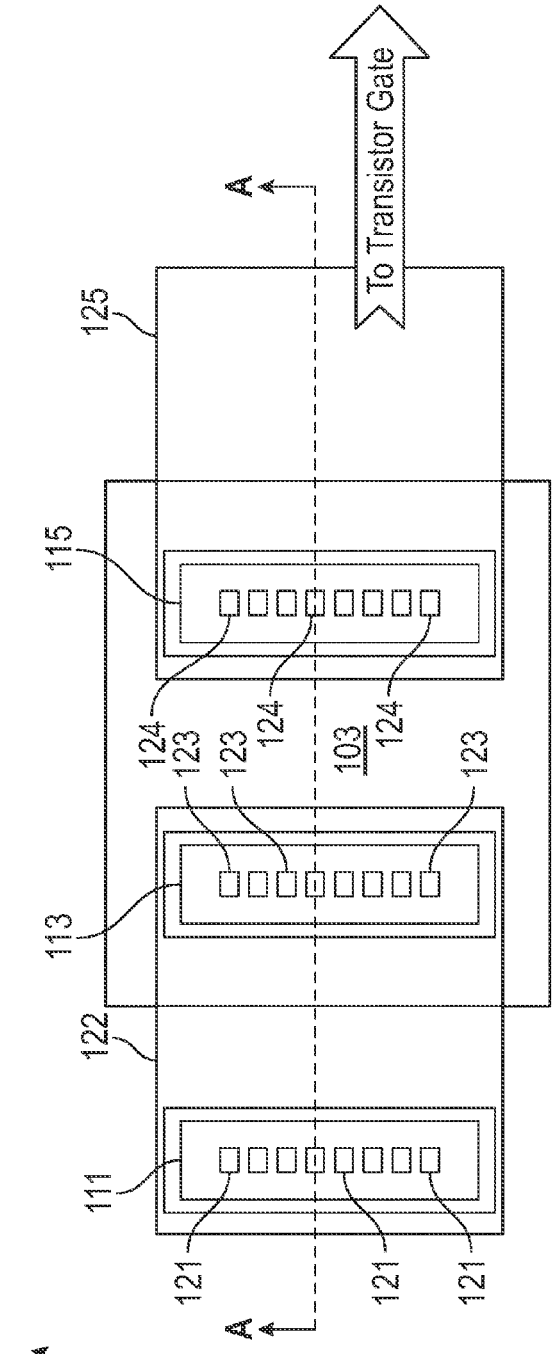

FIGS. 2A and 2B provide cross-sectional and top views, respectively, of a bi-directional protection diode 200 applied in the context of an exemplary n-type field effect transistor functionality. The diode 200 is the same in all material aspects to the diode 100 shown in FIG. 1, with the proviso that the substrate 100 is specified as a p-type substrate. FIG. 2B also provides a top view of the bi-directional protection diode 200. As shown, the bi-directional protection diode 200 may include a plurality of contacts 121, 123, and 124 at each of the raises structures 104, 105, and 106. As such, the raised structures may extend laterally (i.e., perpendicular to the direction of spacing between such structures) for a distance sufficient to accommodate the desired number of contacts. The conductive connection lines 122, 125 may also be provided with sufficient lateral width to accommodate and provide connection to each of the contacts, however many are provided.

As noted above, the bi-directional protection diodes of the present disclosure may also be used in connection with p-type field effect transistor functionalities. In such cases, an n-type substrate would be provided, and the diode would be positioned within a p-type "cut-out" region of the substrate to allow for the formation of the wells and raised portions having the above-noted doping profiles. The cut-out portion would be provided to a sufficient size to allow for lateral spacing margins between the protection diode and the n-type substrate, that is, to an area that is slightly larger than the area occupied by the protection diode.

Figure 3:
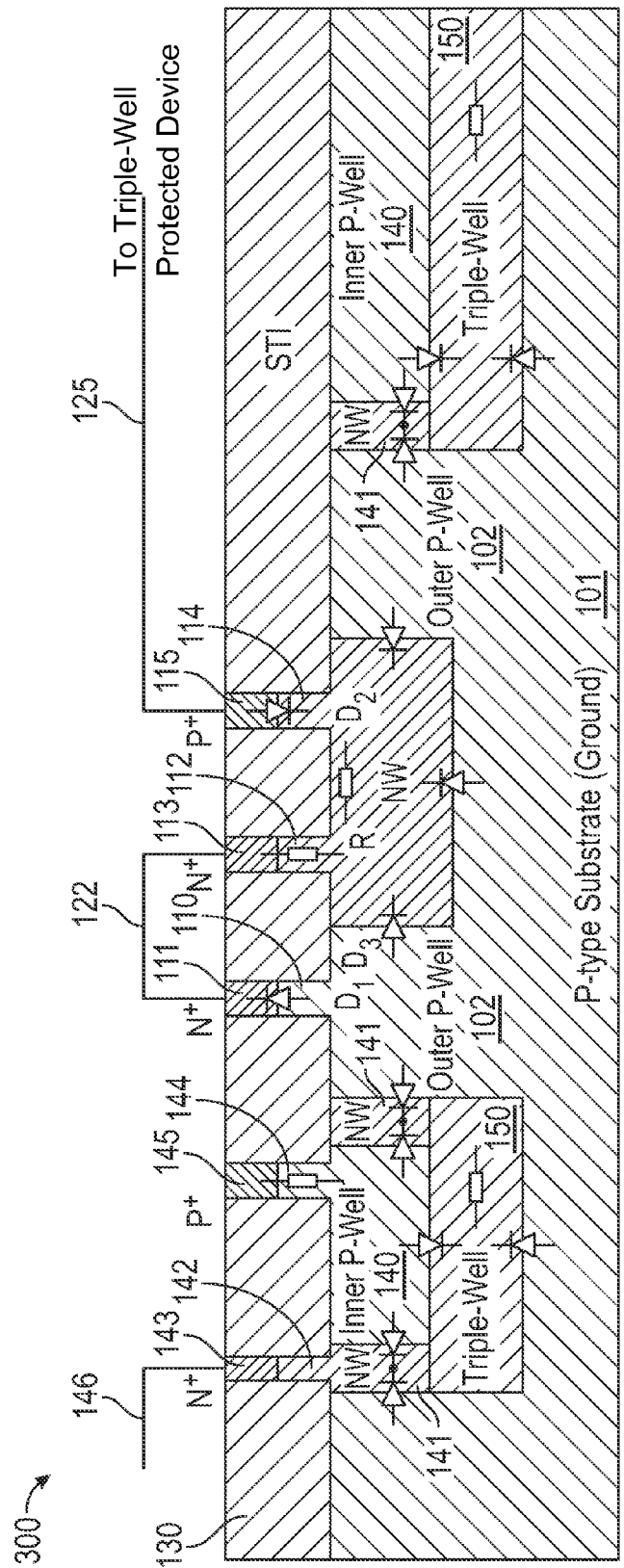
FIG. 3 provides a cross-sectional view with a super-imposed circuit diagram of the bi-directional protection diode of FIG. 1 applied in the context of an exemplary triple-well semiconductor substrate.

FIG. 3 provides a cross-sectional view with a super-imposed circuit diagram of a bi-directional protection diode 300 applied in the context of an exemplary triple-well semiconductor substrate. The diode 300 is the same in all material aspects to the diode 100 shown in FIG. 1, with the proviso that the substrate 100 is specified as including a triple-well structure, as described below. As generally known in the art, and as shown in FIG. 3, a triple-well structure is generally defined as including a substrate 100 that is doped with a first type of dopant material (e.g., p-type as shown), and a first well (having a laterally extending portion 150 and vertically extending portions 150) formed in the substrate, the first (141, 150) well being doped with a second type of dopant material that is of a type opposite the first type of dopant material (e.g., n-type as shown). The triple-well structure further includes a second or "inner" well 140 formed in the substrate and within the first well (i.e., above portion 150 and between portions 141), the second 140 well being doped with a dopant material that is the same type as the first type of dopant material (e.g., p-type as shown). Still further, the triple well structure includes an electrical contact for the first well and an electrical contact for said second well. The electrical contact for the first well may be implemented using an additional raised structure of the same doping type (e.g., n-type) in contact with one of the portions 141, the raised structure having portions 142 and 143 (portion 143 being more heavily doped), the raised structure being in electrical connection with conductive line 146 of M1. The electrical contact for the second well may be implemented using an additional raised structure of the same doping type (e.g., p-type) in contact with the second well 140, the raised structure having portions 144 and 145 (portion 145 being more heavily doped). Additional details regarding an exemplary triple-well configuration are disclosed in U.S. Pat. No. 7,180,136 B2 to Wei et al.

The bi-directional diode 300 may be implemented adjacent to a triple structure as shown in FIG. 3. That is, the p-well 102 and the n-well 103 may be provided in the p-type substrate 101 outside of the area defined by the first well of the triple-well structure (141, 150). In this manner, both the wells of the triple well structure (141/150, 140) and the wells of the bi-directional protection diode 300 (102, 103) may be provided in the same substrate 101. It should be noted that in the context of the triple-well structure, the connection line 125 extends to a protected device that is inside of the triple-well structure. That is, the connection line 125 extends to a (non-illustrated) gate of a protected device inside of the triple-well structure.

Accordingly, described herein are various embodiments of integrated circuits that include bi-directional protection diode structures. The disclosed embodiments are operable under a broad range of testing conditions, including the application of both positive and negative biases. That is, the integrated circuits include test structures with protection diodes that are capable of operating under both positive and negative bias conditions. As such, the disclosed structures are suitable for use in test structures that employ non-standard biasing conditions during various testing procedures.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. An integrated circuit comprising an active circuit portion comprising a plurality of active semiconductor devices and a test circuit portion, separated from the active circuit portion, comprising a test circuit structure comprising a transistor and a bi-directional protection diode structure, wherein the bi-directional protection diode structure comprises:
a semiconductor substrate, and within the semiconductor substrate, a first well region having a first conductivity type and a second well region that is adjacent to the first well region and that has a second conductivity type;
a first raised structure disposed over and adjacent to the first well region and comprising a first p-n junction diode, a second raised structure disposed over and adjacent to the second well region and having the second conductivity type, and a third raised structure disposed over and adjacent to the second well region and comprising a second p-n junction diode; and a first conductive connection line that electrically connects the first raised structure to the second raised structure and a second conductive connection line that electrically connects the third raised structure to a gate of the transistor.

2. The integrated circuit of claim 1, wherein the semiconductor substrate comprises a p-type substrate.

3. The integrated circuit of claim 1, wherein the semiconductor substrate comprises an n-type substrate.

4. The integrated circuit of claim 1, wherein the first conductivity type is p-type.

5. The integrated circuit of claim 1, wherein the second conductivity type is n-type.

6. The integrated circuit of claim 1, wherein the first raised structure comprises a p-type portion adjacent to the first well region and an n-type portion adjacent to the p-type portion.

7. The integrated circuit of claim 1, wherein the second raised structure comprises a first portion adjacent to the second well and a second portion adjacent to the first portion, and wherein the second portion has a concentration of doping of the second conductivity type that is greater than a concentration of doping in the first portion.

8. The integrated circuit of claim 1, wherein the third raised structure comprises an n-type portion adjacent to the second well region and a p-type portion adjacent to the n-type portion.

9. The integrated circuit of claim 1, further comprising contact structures extending to a first metallization layer from each of the first, second, and third raised structures.

10. The integrated circuit of claim 1, wherein the contact structures of the first and second raised structures are physically connected with the first conductive connection line, the first conductive connection line being positioned in the first metallization layer, and wherein the contact structure of the third raised structure is physically connected with the second conductive connection line, the second conductive connection line being positioned in the first metallization layer.

11. The integrated circuit of claim 1, further comprising, within the semiconductor substrate, a triple-well structure.

12. The integrated circuit of claim 1, further comprising an interlayer dielectric disposed over the semiconductor substrate and over the first, second, and third raised structures.

13. The integrated circuit of claim 1, wherein the test circuit portion is positioned within a frame portion of the integrated circuit.

14. An integrated circuit comprising:
an active circuit portion comprising a plurality of active semiconductor devices; and
a test circuit portion, separated from the active circuit portion and positioned within a frame portion of the integrated circuit, and comprising a test circuit structure comprising a p-type or an n-type transistor and a bi-directional protection diode structure, wherein the bi-directional protection diode structure comprises:
a semiconductor substrate comprising a p-type semiconductor material wherein the transistor is a n-type transistor or an n-type semiconductor material wherein the transistor is a p-type transistor;
within the semiconductor substrate, a p-type well region and an n-type well region that is adjacent to the p-type well region;
a first raised structure disposed over and adjacent to the p-type well region and comprising a first p-n junction diode, wherein a p-type portion of the first p-n junction diode is adjacent to the p-type well and an n-type portion of the first p-n junction diode is physically separated from the p-type well by the p-type portion;

a second raised structure disposed over and adjacent to the n-type well, the second raised structure being wholly n-type and comprising first and second portions, wherein the first portion of the second raised structure is adjacent to the n-type well and has a doping concentration that is less than a doping concentration of the second portion of the first raised structure, the second portion being physically separated from the n-type well by the first portion of the second raised structure;

a third raised structure disposed over and adjacent to the n-type well region and comprising a second p-n junction diode, wherein an n-type portion of the second p-n junction diode is adjacent to the n-type well and a p-type portion of the second p-n junction diode is physically separated from the n-type well by the n-type portion;

a first contact structure electrically connecting the n-type portion of the first p-n junction diode to a first metallization layer of the integrated circuit, a second contact structure electrically connecting the second portion of the second raised structure to the first metallization layer, and a third contact structure electrically connecting the p-type portion of the second p-n junction diode to the first metallization layer; and a first conductive connection line in the first metallization layer that electrically connects the first contact structure to the second contact structure, and a second conductive connection line in the first metallization layer that electrically connects the third contact structure to a gate of the transistor.

15. The integrated circuit of claim 14, further comprising an interlayer dielectric disposed over the semiconductor substrate and over the first, second, and third raised structures.

16. The integrated circuit of claim 14, further comprising, within the semiconductor substrate, a triple-well structure.

17. An integrated circuit comprising:

a test circuit portion for testing the functionality of the integrated circuit during or after fabrication that comprises first, second, and third diode structures and a resistor structure, wherein the first and third diode structures are in parallel with one another and in series with the resistor, wherein the resistor and the first and third diode structures are in series with the second diode structure, and wherein the first and third diode structures are configured for current flow in a first direction and the second diode structure is configured for current flow in a second direction that is opposite the first direction.

18. The integrated circuit of claim 17, wherein the first and third diode structures are grounded to a substrate of the integrated circuit.

19. The integrated circuit of claim 18, wherein the second diode structure is electrically connected with a gate of a transistor of the integrated circuit.

20. The integrated circuit of claim 19, wherein the third diode structure has a breakdown voltage that is greater than a breakdown voltage of the first diode structure such that, upon application of a potential difference, current flows through the first diode structure but not the third diode structure.

* * * * *